(12) United States Patent
Usui

(10) Patent No.: US 7,049,701 B2
(45) Date of Patent: May 23, 2006

(54) SEMICONDUCTOR DEVICE USING INSULATING FILM OF LOW DIELECTRIC CONSTANT AS INTERLAYER INSULATING FILM

(75) Inventor: Takamasa Usui, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/734,106

(22) Filed: Dec. 15, 2003

(65) Prior Publication Data

US 2005/0082577 A1    Apr. 21, 2005

(30) Foreign Application Priority Data

Oct. 15, 2003    (JP) .............................. 2003-355410

(51) Int. Cl.
    *H01L 23/48* (2006.01)
    *H01L 23/52* (2006.01)
    *H01L 29/40* (2006.01)

(52) U.S. Cl. ...................... 257/773; 257/774; 257/775; 257/776

(58) Field of Classification Search ................ 257/211, 257/773, 775, 776, 774; 174/261
See application file for complete search history.

(56) References Cited

U.S. PATENT DOCUMENTS 6,399,897 B1 *   6/2002   Umematsu et al. ......... 174/261

FOREIGN PATENT DOCUMENTS

| JP | 3121311 | 10/2000 |
| JP | 2000-349447 | 12/2000 |

* cited by examiner

*Primary Examiner*—Steven Loke
(74) *Attorney, Agent, or Firm*—Finnegan, Henderson, Farabow, Garrett & Dunner, L.L.P.

(57) ABSTRACT

At least one electrode pad is formed above the surface of a semiconductor substrate. A multilevel interconnection configuration is formed between the electrode pad and the semiconductor substrate. The multiple levels of interconnections in the multilevel interconnection configuration are insulated from one another by an insulating film of low dielectric constant. A dummy interconnection configuration is formed at least within the insulating film around the periphery of the electrode pad.

7 Claims, 11 Drawing Sheets

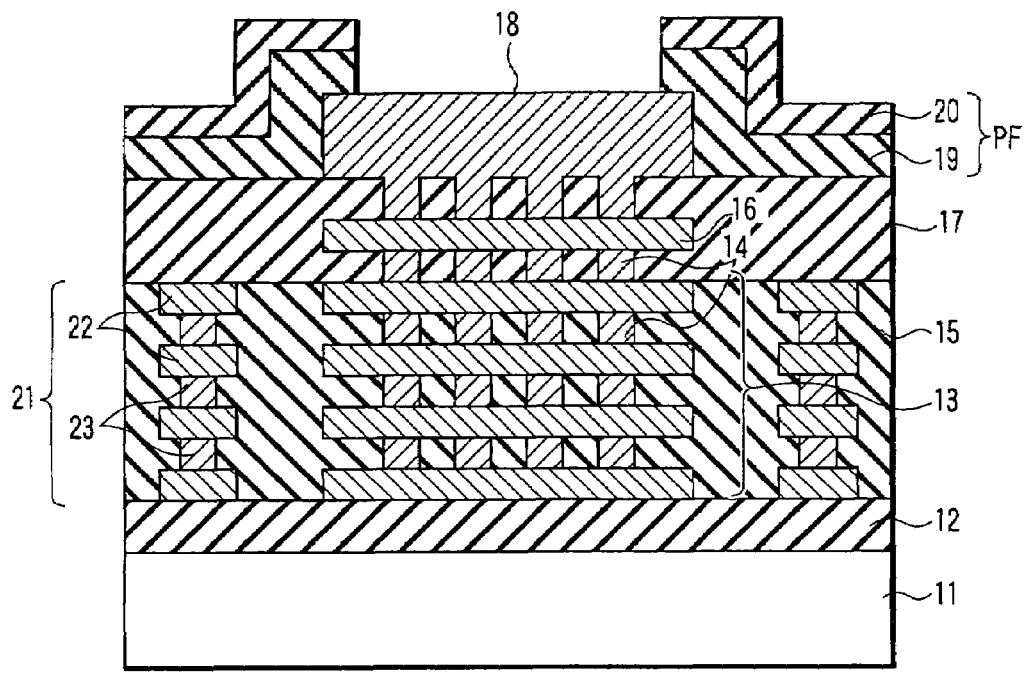
F I G. 2
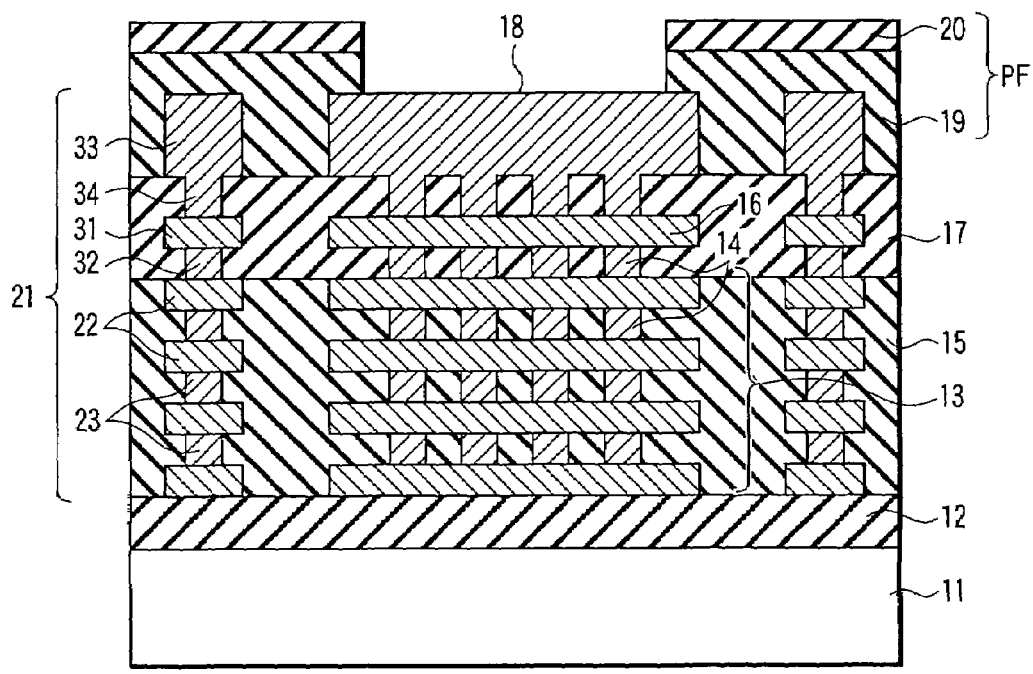
F I G. 3

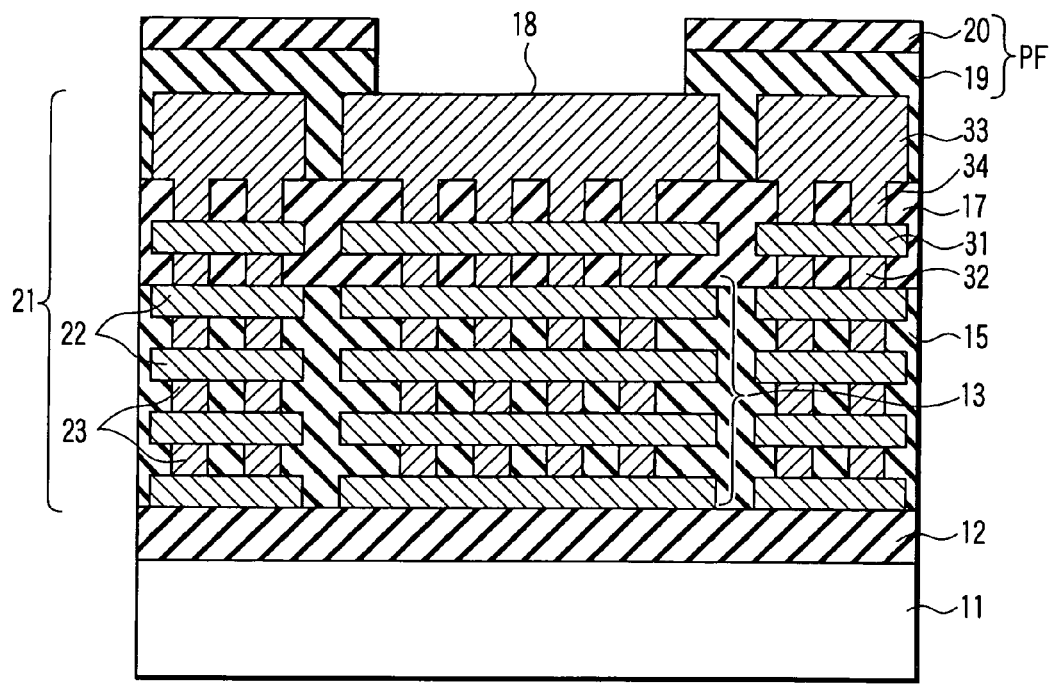
F I G. 6
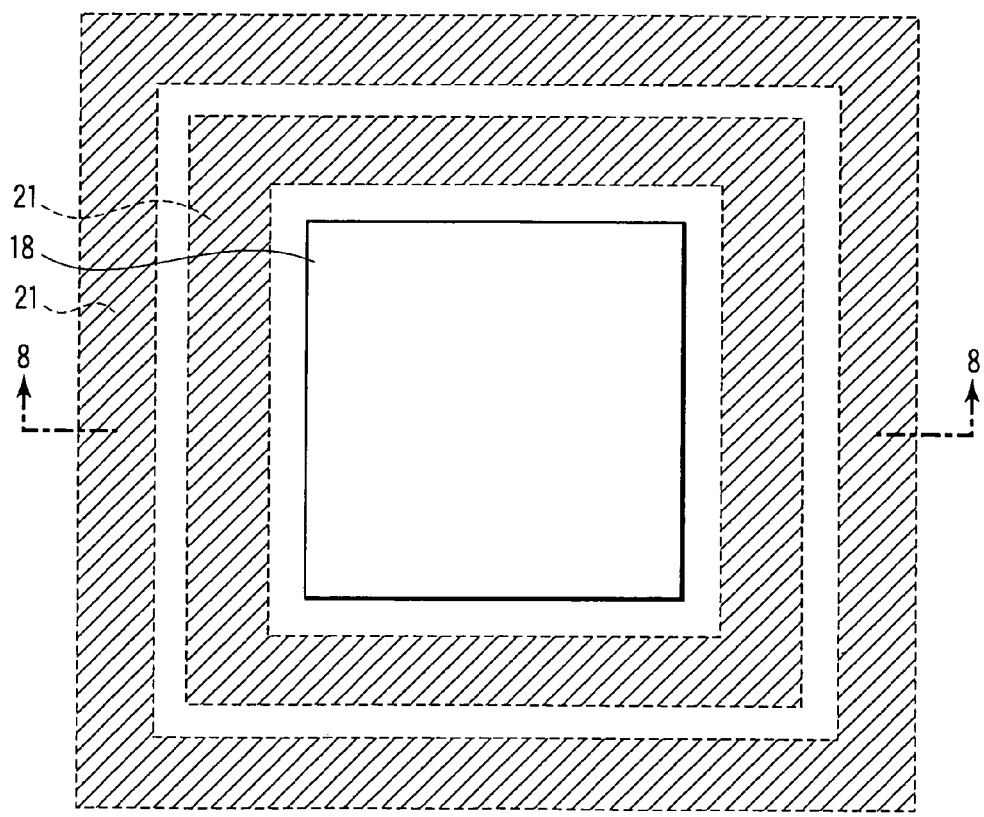
F I G. 7

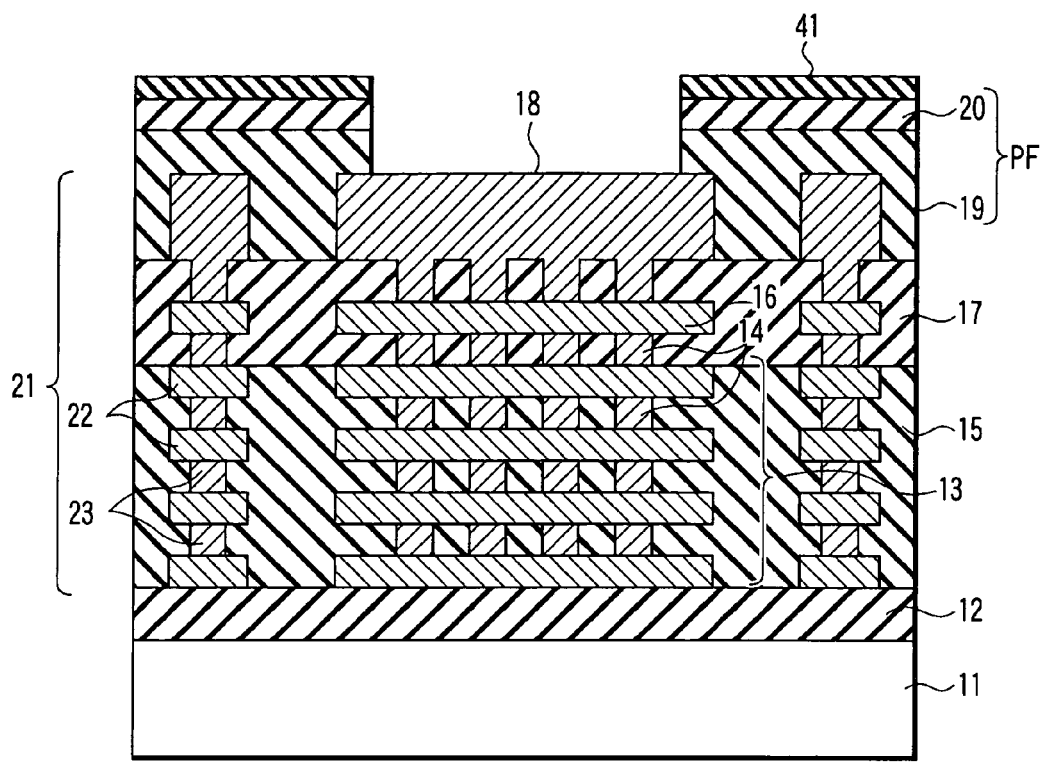
F I G. 16
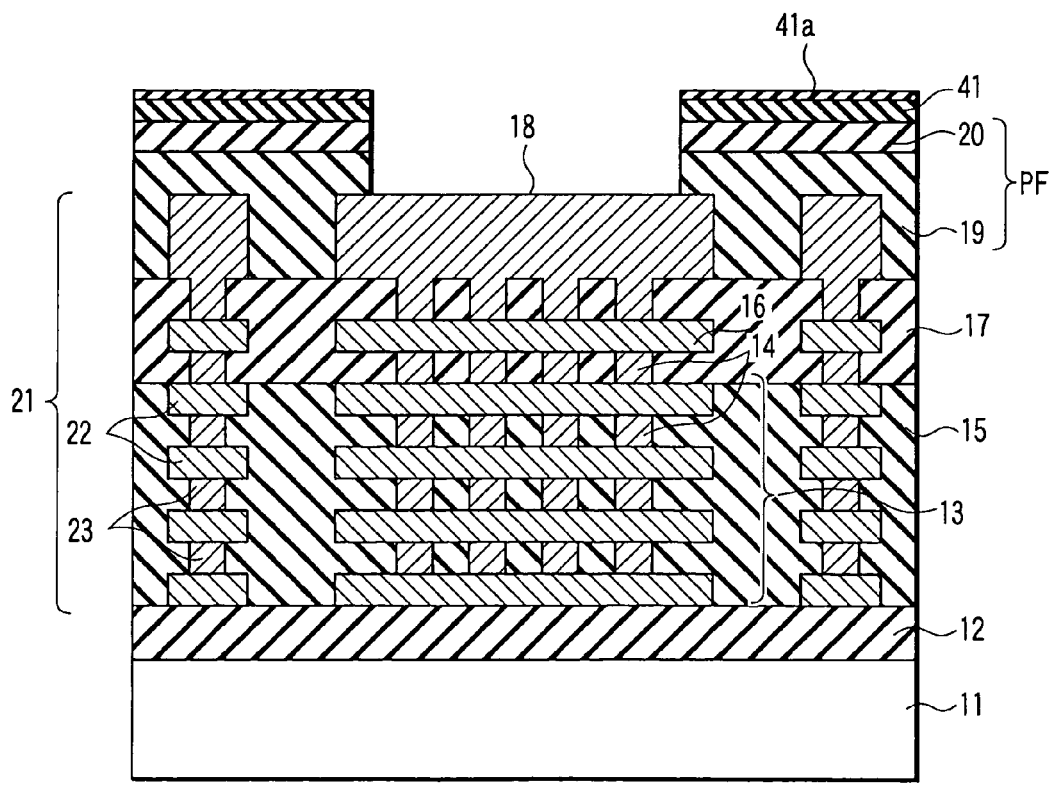
F I G. 17

| | | Young's modulus (GPa) |
|---|---|---|
| Metal material | Copper | 150 |
| | Tantalum | 180 |
| | Silicon | 130 |
| Insulating films | SiO$_2$ | 57 |
| | SiN | 98 |
| Insulating films of low dielectric constant | SiOC | 2-20 |
| | Organic SiOCH | 1-10 |

SEMICONDUCTOR DEVICE USING INSULATING FILM OF LOW DIELECTRIC CONSTANT AS INTERLAYER INSULATING FILM

CROSS-REFERENCE TO RELATED APPLICATIONS

This application is based upon and claims the benefit of priority from the prior Japanese Patent Application No. 2003-355410, filed Oct. 15, 2003, the entire contents of which are incorporated herein by reference.

BACKGROUND OF THE INVENTION

1. Field of the Invention

The present invention relates to a semiconductor device which has multiple levels of interconnections formed using an insulating film of low dielectric constant as an interlayer insulating film and more specifically to the structure of the periphery of a bonding pad.

2. Description of the Related Art

In recent years, the dimensions of devices have been increasingly scaled down and the spacing between each interconnection has been increasingly reduced to enhance the performance of LSIs. As the spacing between each interconnection becomes less, the capacitance between interconnections increases, reducing the propagation speed of signals. Therefore, to enhance the performance of LSIs, an insulating film of low dielectric constant is used as the interlayer insulating film. Insulating films of low dielectric constant include inorganic insulating, such as SiOC, organic insulating films, and SiOF. These films, while being low in dielectric constant, are not high in mechanical strength, e.g., Young's modulus, hardness, resistance to crack. That is, the amount of stress that leads to destruction is considerably low in comparison with other insulating films, for example, $SiO_2$, SiN.

With LSIs using multiple levels of interconnections (multilevel interconnection configuration), of, for example, ten levels of interconnections, the first to the eighth or ninth levels of interconnections are insulated by an insulating film of low dielectric constant. In general, the lower the interconnection layers, the greater the effect of the capacitance between interconnection layers on performance. Therefore, the use of insulating film of low dielectric constant is more favorable. With LSIs using an insulating film of low dielectric constant, electrode pads are formed after the formation of multiple levels of interconnections.

FIG. 18 shows an example of a semiconductor device using an insulating film of low dielectric constant as an interlayer insulating film. A semiconductor substrate 11 in which, though not shown, devices, such as transistors, have been formed is formed on top with an insulating film 12. For example, four levels of interconnections 13 are formed on the insulating film 12. These interconnection layers 13 are interconnected by vias 14 and insulated from one another by an insulating film 15 of low dielectric constant as an interlayer insulating film. A layer of interconnection 16 above the insulating film 15 is insulated by an insulating film 17 such as a silicon nitride film. An electrode pad 18 is formed on the insulating film 17 so that it is connected to the interconnection layer 16. A silicon oxide film 19 and a silicon nitride film 20 are formed in sequence on the insulating film 17 to act as a passivation film PF. A window is formed in the silicon oxide film 19 and the silicon nitride film 20 to expose the electrode pad 18.

FIG. 19 shows Young's moduli of metal materials and insulating films used for multiple levels of interconnections of LSIs. Young's modulus is one parameter that indicates mechanical strength. The Young's moduli of metal materials are all more than 100 GPa. In contrast, the Young's moduli of insulating films are all less than 100 GPa. In particular, the Young's moduli of insulating films of low dielectric constant made of materials called Low-k materials are 20 GPa or less. For this reason, insulating films made of Low-k materials are low in mechanical strength.

For a semiconductor device in which an insulating film of low dielectric constant is used as an interlayer insulating film and metal interconnections are formed below an electrode pad, a technique has been developed which prevents the insulating film from cracking at the time of wire bonding (see, for example, Japanese Patent Publication No. 3121311).

Moreover, a multilayer printed wiring board has been developed in which a member that prevents the progress of cracking is embedded in an insulating member formed around the periphery of a part-mounting conductive pad (see, for example, Japanese Unexamined Patent Publication No. 2000-349447, Japanese Patent Publication No. 3121311).

As described above, the insulating films of low dielectric constant are low in mechanical strength. For this reason, the shock resulting from bonding a wire to the electrode pad 18 will cause cracking to occur in the insulating film 15 of low dielectric constant, the silicon oxide film 19, and the silicon nitride film 20.

That is, as shown in FIG. 20, at the time of bonding a wire 100 to the electrode pad 18, if the wire is not precisely aligned with the electrode pad and consequently a portion of it comes into contact with the insulating films around the pad, cracking will occur in the insulating films 15, 17, 19 and 20 as shown in FIG. 19 due to mechanical force at wire bonding time. Moisture or oxygen infiltrating through the cracking will corrode or oxidize the metal of the interconnection layers 13 and the vias. FIG. 20 shows at 102 corrosion on the interconnection. For this reason, a semiconductor device is demanded which is adapted to preventing the occurrence of cracking in an insulating film of low dielectric constant below an electrode pad at wire bonding time, thereby allowing the degradation of interconnection layers to be suppressed/eliminated.

BRIEF SUMMARY OF THE INVENTION

According to a first aspect of the present invention, there is provided a semiconductor device comprising: a semiconductor substrate; at least one electrode pad formed above the semiconductor substrate; a multilevel interconnection configuration disposed between the electrode pad and the semiconductor substrate, the multilevel interconnection configuration including a number of interconnection layers; a first insulating film of low dielectric constant which is formed above the semiconductor substrate to insulate the interconnection layers from one another; and a dummy interconnection configuration formed at least within the first insulating film around the periphery of the electrode pad.

According to a second aspect of the present invention, there is provided a semiconductor device comprising: a semiconductor substrate; at least one electrode pad formed above the semiconductor substrate; a multilevel interconnection configuration disposed between the electrode pad and the semiconductor substrate, the multilevel interconnection configuration including a number of interconnection layers; a first insulating film of low dielectric constant which is formed above the semiconductor substrate to insulate the interconnection layers from one another; a first dummy interconnection configuration formed at least within the first insulating film around the periphery of the electrode pad; and a second dummy interconnection configuration formed on the opposite side of the first dummy interconnection configuration from the electrode pad.

According to a third aspect of the present invention, there is provided a semiconductor device comprising: a semiconductor substrate; a plurality of electrode pads formed above the semiconductor substrate; a multilevel interconnection configuration disposed between the electrode pads and the semiconductor substrate, the multilevel interconnection configuration including a number of interconnection layers; a first insulating film of low dielectric constant which is formed above the semiconductor substrate to insulate the interconnection layers from one another; and a dummy interconnection configuration formed at least within the first insulating film around the periphery of the electrode pads.

BRIEF DESCRIPTION OF THE SEVERAL VIEWS OF THE DRAWING

FIG. 2 is a sectional view taken along line 2—2 of FIG. 1;

FIG. 3 is a sectional view of a semiconductor device according to a second embodiment of the present invention;

FIG. 6 is a sectional view of a semiconductor device according to a fourth embodiment of the present invention;

FIG. 7 is a plan view of a modification of the fourth embodiment of the present invention;

FIG. 16 is a sectional view of a semiconductor device according to a seventh embodiment of the present invention;

FIG. 17 is a sectional view of a modification of the seventh embodiment of the present invention;

DETAILED DESCRIPTION OF THE INVENTION

The preferred embodiments of the present invention will be described hereinafter with reference to the accompanying drawings.

(First Embodiment)

Figure 1:
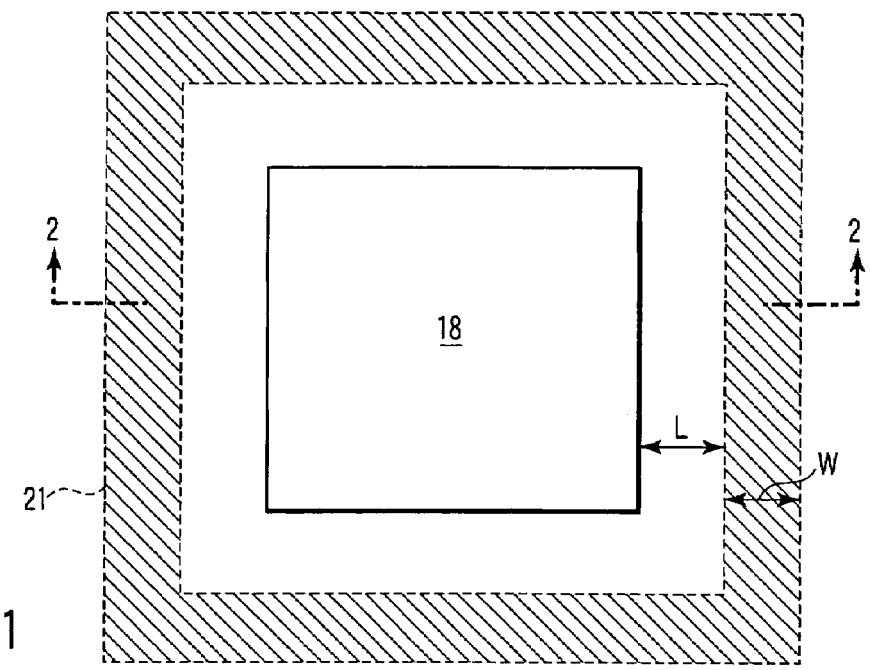
FIG. 1 is a plan view of a semiconductor device according to a first embodiment of the present invention.

FIGS. 1 and 2 show a semiconductor device according to a first embodiment of the present invention. As shown in FIGS. 1 and 2, a ring-like continuous dummy multilevel interconnection configuration 21 is disposed in an insulating film 15 of low dielectric constant formed around the periphery of an electrode pad 18. The dummy multilevel interconnection configuration comprises a plurality of interconnection layers 22 corresponding in number to the layers of the multilevel interconnection configuration below the pad and a plurality of vias 23 that interconnect the interconnection layers 22.

That is, in FIG. 2, a semiconductor substrate 11 in which, though not shown, devices, such as transistors, have been formed is formed on top with an insulating film 12. For example, four levels of interconnections 13 are formed as the multilevel interconnection configuration on the insulating film 12. The interconnection layers 13 are interconnected by vias 14. The interconnection layers 13 are insulated from one another by the insulating film 15 of low dielectric constant. A layer 16 of interconnection above the insulating film 15 is insulated by an insulating film 17 such as a film of silicon nitride. The electrode pad 18 is formed on the insulating film 17 so that it is connected to the interconnection layer 16. A silicon oxide film 19 and a silicon nitride film 20, which act as a passivation film PF, are formed on the insulating film 17 so as to expose the electrode pad 18. The passivation film PF may comprise only a film of silicon nitride by way of example.

The dummy multilevel interconnection configuration 21 is formed within the insulating film 15 of low dielectric constant to surround the periphery of the electrode pad 18. The dummy multilevel interconnection configuration is formed in the same processes employed when the layers of the multilevel interconnection configuration 13 and the vias 14 are formed. For this reason, the dummy interconnection configuration 21 is located between the insulating films 12 and 17, as in the one of the multilevel interconnection configuration 13.

Where the dummy multilevel interconnection configuration 21 is to be formed is determined as follows:

The shortest distance of the horizontal distance L between the edge of the electrode pad 18 and the dummy multilevel interconnection 21 is the minimum distance in the semiconductor device design rules and the longest distance corresponds to the maximum displacement of a bonding wire from the electrode pad 18. Specifically, the longest distance is approximately 5 μm. It is desirable to form the dummy multilevel interconnection at a distance of about 2 μm from the electrode pad 18.

As the width W of the dummy multilevel interconnection 21 increases, the mechanical strength can be increased, allowing it to function as a guard ring. With increasing width W, however, the chip area increases undesirably. Thus, the width W of the dummy interconnection 21 with the longest distance L in mind is about 4 μm at maximum (the distance between the electrode pad and the dummy interconnection is 1 μm) and about 0.1 μm (the minimum dimension in the design rules) at minimum. The same applies to the width of the vias: that is, about 4 μm at maximum and about 0.1 μm at minimum. It is desirable that the width of the dummy interconnection be, for example, 1 μm and the width of the associated via be in the range of 0.2 to 0.4 μm.

Figures 18, 19:
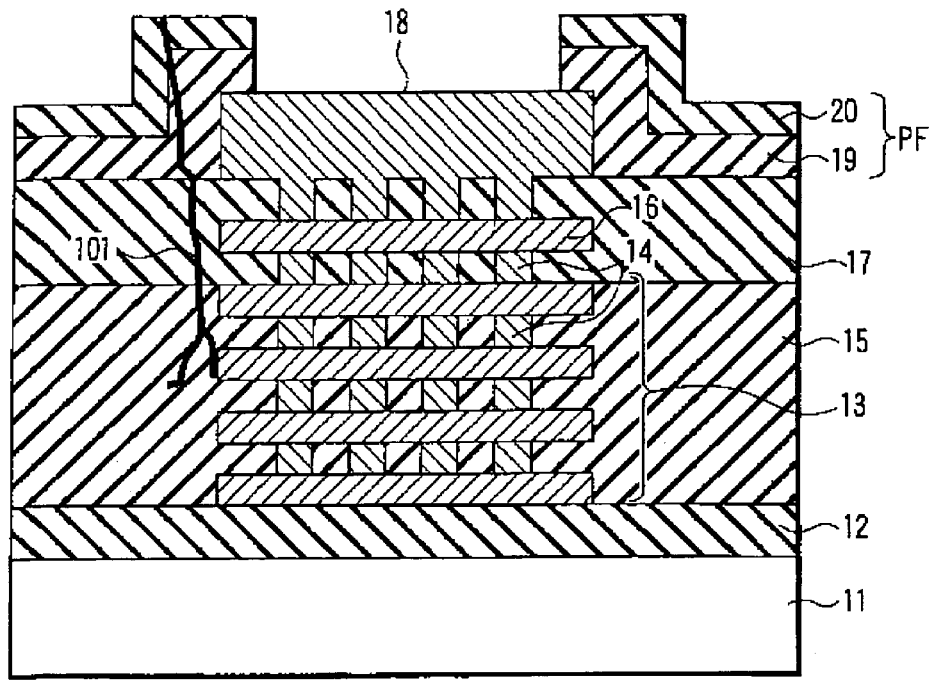
FIG. 18 is a sectional view of a conventional semiconductor device.
FIG. 19 shows the Young's moduli of materials for interconnections.
Figure 20:
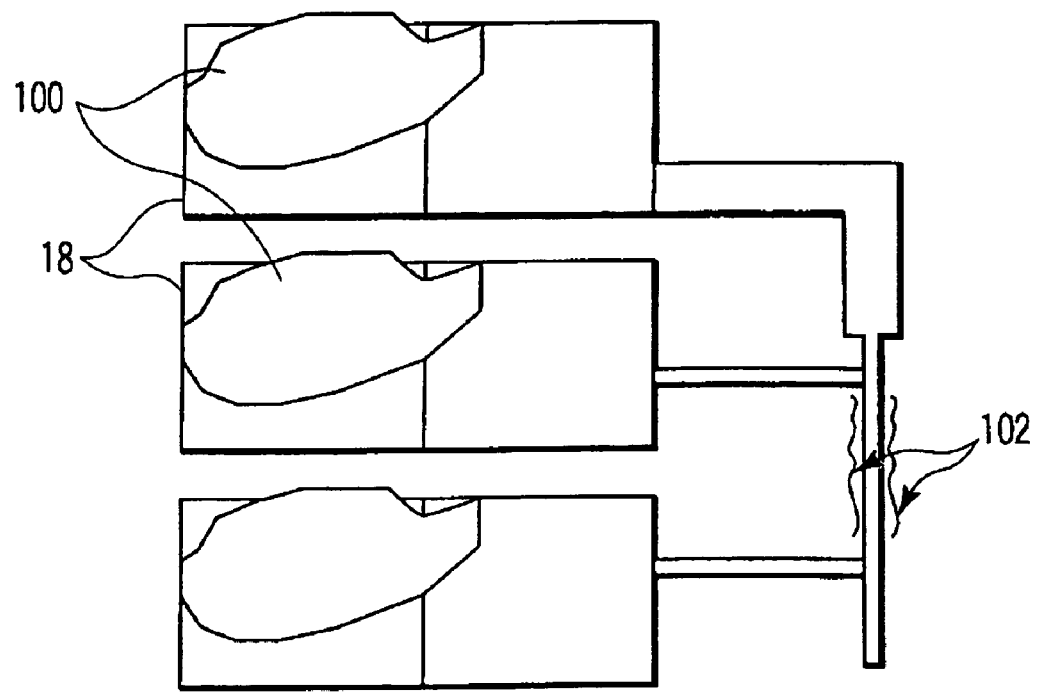
FIG. 20 is a diagram for use in explanation of misalignment of a wire relative to an electrode pad at wire bonding time.

The dummy multilevel interconnection 21, the multilevel interconnection 13 and the vias are made of, for example, copper (Cu). Copper has a Young's modulus of 150 GPa, as shown in FIG. 18, and is therefore mechanically 10 to 100 times stronger than the insulating films of low dielectric constant. For this reason, the use of dummy interconnections made of a metal material around the electrode pad allows the Young's modulus of the insulating film around and below the pad to be increased drastically, i.e., its mechanical strength to be increased.

According to the first embodiment described above, the dummy multilevel interconnection configuration 21 composed of the multiple levels of interconnections 22 and the vias 23 is formed within the insulating film 15 of low dielectric constant around the periphery of the electrode pad 18, thereby reinforcing the insulating film 15. For this reason, it becomes possible to enhance cracking resistance of the insulating film of low mechanical strength positioned as an interlayer insulating film below the electrode pad 18 in the case where a boding wire is displaced from the desired position on the pad.

Moreover, the dummy multilevel interconnection configuration 21 is formed continuously so as to surround the electrode pad 18. Thus, even if cracking occurs in the insulating film below the electrode pad 18, the undesirable infiltration of moisture or oxygen can be prevented by the dummy multilevel interconnection configuration 21, thus keeping the multilevel interconnection configuration 13 from degrading.

In addition, the dummy multilevel interconnection configuration 21 can be formed in the same manufacturing steps as employed when the multilevel interconnection configuration 13 is formed; thus, only the design of a two-dimensional pattern is required. Therefore, there is no necessity of special materials and processes, which provides ease of manufacture and keeps the manufacturing cost from increasing greatly.

Although the interconnection layers and the vias have been described as being made of the same material, they may be made of different materials.

(Second Embodiment)

FIG. 3 shows a second embodiment of the present invention. In the first embodiment, the dummy multilevel interconnection configuration 21 is formed only within the insulating film 15 of low dielectric constant. Unlike the first embodiment, in the second embodiment, the dummy multilevel interconnection configuration 21 is formed within both the insulating film 17 on the insulating film 15 of low dielectric constant and the silicon oxide film 19.

That is, as shown in FIG. 3, an interconnection layer 31 and its associated vias 32 as well as an interconnection layer 16 and its associated vias 14 are formed within the insulating film 17 and an interconnection layer 33 is formed within the silicon oxide film 19. The interconnection layer 33 is connected to the underlying interconnection layer 31 through vias 34.

According to the second embodiment, the dummy multilevel interconnection configuration 21 is also formed within the insulating film 17 and the silicon oxide film 19 overlying the insulating film 15 of low dielectric constant. This allows the insulating films 15, 17, 19 and 20 to be much less susceptible to wire-bonding-induced cracking.

(Third Embodiment)

Figure 4:
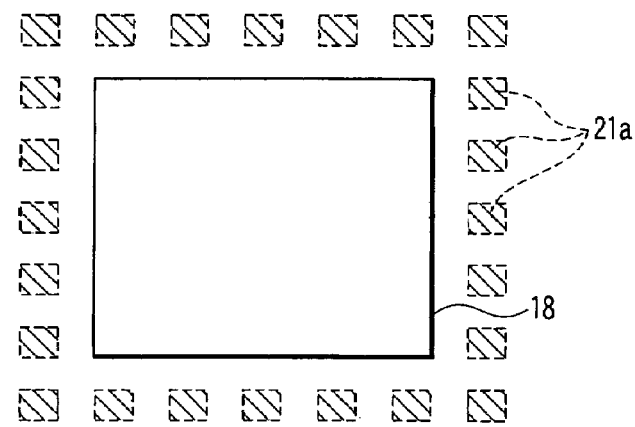
FIG. 4 is a plan view of a semiconductor device according to a third embodiment of the present invention.
Figure 5:
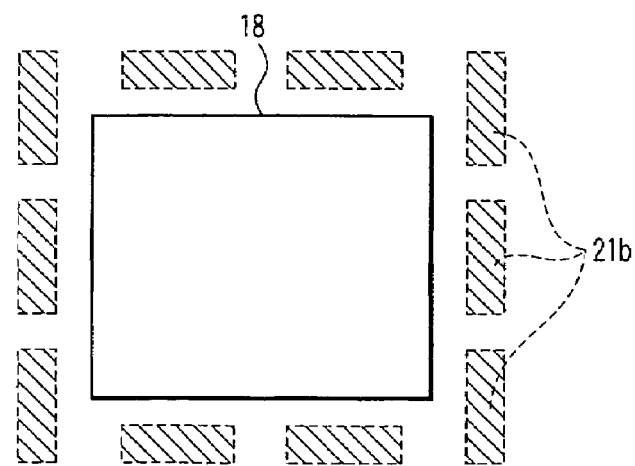
FIG. 5 is a plan view of another example of the semiconductor device according to the third embodiment of the present invention.

FIGS. 4 and 5 show a third embodiment of the present invention. In the first and second embodiments, the dummy multilevel interconnection configuration 21 is formed around the electrode pad 18 in the shape of a continuous ring so as to completely surround the multilevel interconnection configuration 13. Unlike the first and second embodiments, in the third embodiment, the dummy multilevel interconnection configuration 21 is divided into interconnection patterns which are, for example, square or rectangular in plane shape. That is, FIG. 4 shows a configuration such that square-shaped dummy multilevel interconnection patterns 21a are arranged around the electrode pad 18 at regular intervals. FIG. 5 shows a configuration such that rectangular-shaped dummy multilevel interconnection patterns 21b are arranged around the electrode pad 18 at regular intervals.

The third embodiment can also provide substantially the same advantage as the first and second embodiments.

(Fourth Embodiment)

FIG. 6 shows a fourth embodiment of the present invention. In the fourth embodiment, the width of the dummy multilevel interconnection 21 is set to the previously described maximum value and a plurality of vias 23, 32 and 34 is arranged between each interconnection layer.

According to the fourth embodiment, the arrangement of the plurality of vias 23, 32 and 34 between each interconnection layer allows the mechanical strength to be improved further. In the fourth embodiment, the dummy multilevel interconnection configuration 21 may be in the shape of a continuous ring as in the first embodiment or may be such that a plurality of interconnection patterns is arranged at regular intervals as in the third embodiment.

Figure 8:
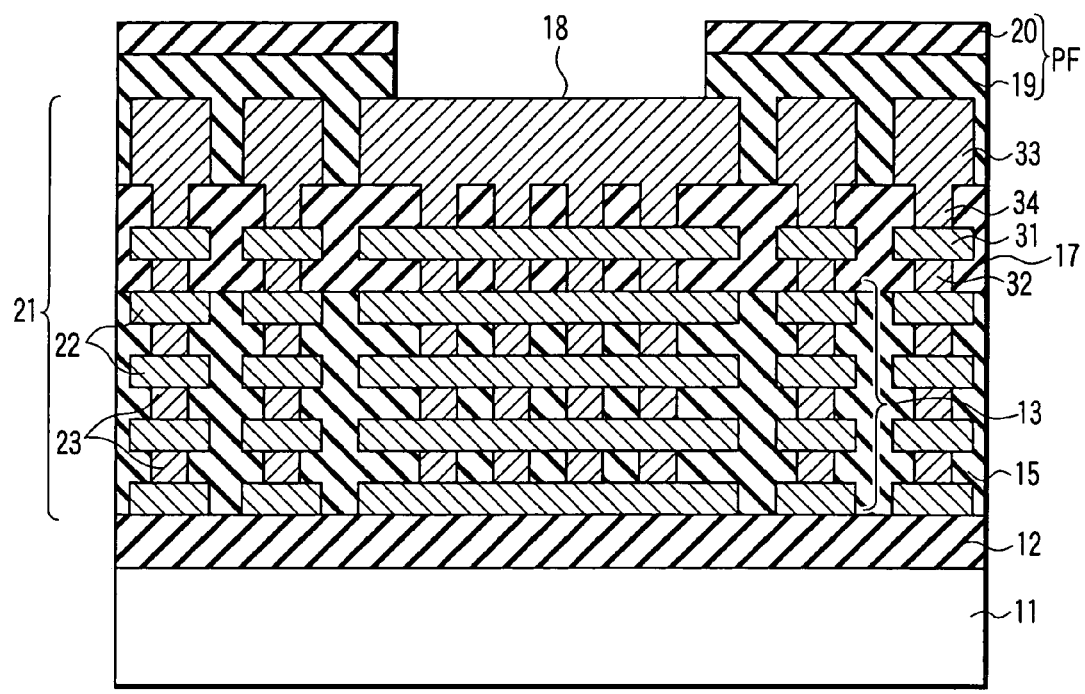
FIG. 8 is a sectional view taken along line 8—8 of FIG. 7.

FIGS. 7 and 8 show a modification of the fourth embodiment. In the fourth embodiment, one dummy multilevel interconnection configuration 21 of large width is formed around the periphery of the electrode pad 18. In contrast, FIGS. 7 and 8 show a double dummy multilevel interconnection configuration in which two dummy multilevel interconnections 21 are formed around the periphery of the electrode pad 18 coaxially with each other within tolerances for the interconnection spacing and the chip size.

Such a configuration allows the effect of preventing infiltration of moisture or oxygen to be further enhanced. In this case as well, the dummy multilevel interconnection configuration 21 may be in the shape of a continuous ring or may be such that a plurality of multilevel interconnection patterns are arranged at regular intervals.

Figure 9:
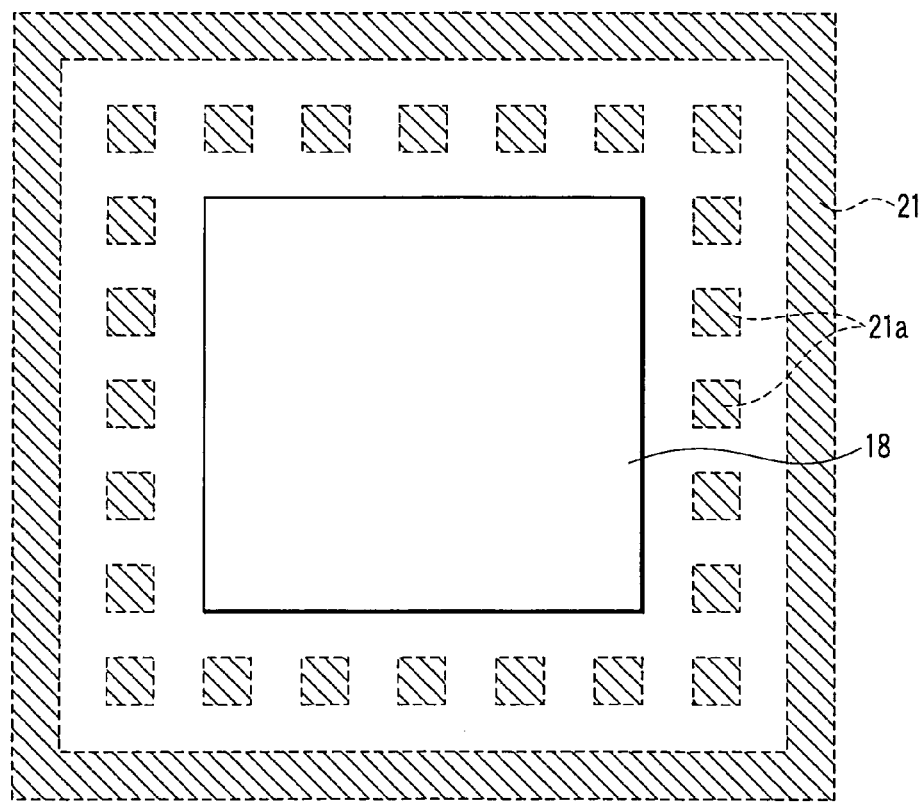
FIG. 9 is a plan view of another modification of the fourth embodiment of the present invention.

In addition, as shown in FIG. 9, the dummy multilevel interconnection configuration 21 in the shape of a ring and dummy multilevel interconnection patterns 21a in the shape of, for example, a square may be combined. The dummy multilevel interconnection configurations may be combined in ways other than those shown in FIGS. 7 and 9.

Furthermore, a triple or greater dummy multilevel interconnection configuration is also possible.

(Fifth Embodiment)

Figure 10:
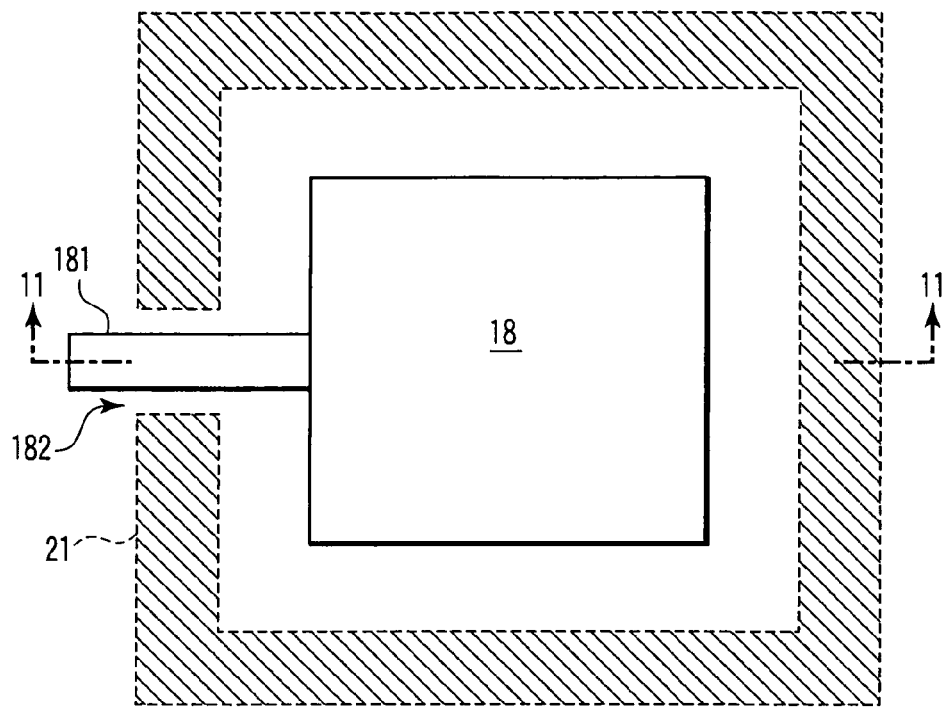
FIG. 10 is a plan view of a semiconductor device according to a fifth embodiment of the present invention.
Figure 11:
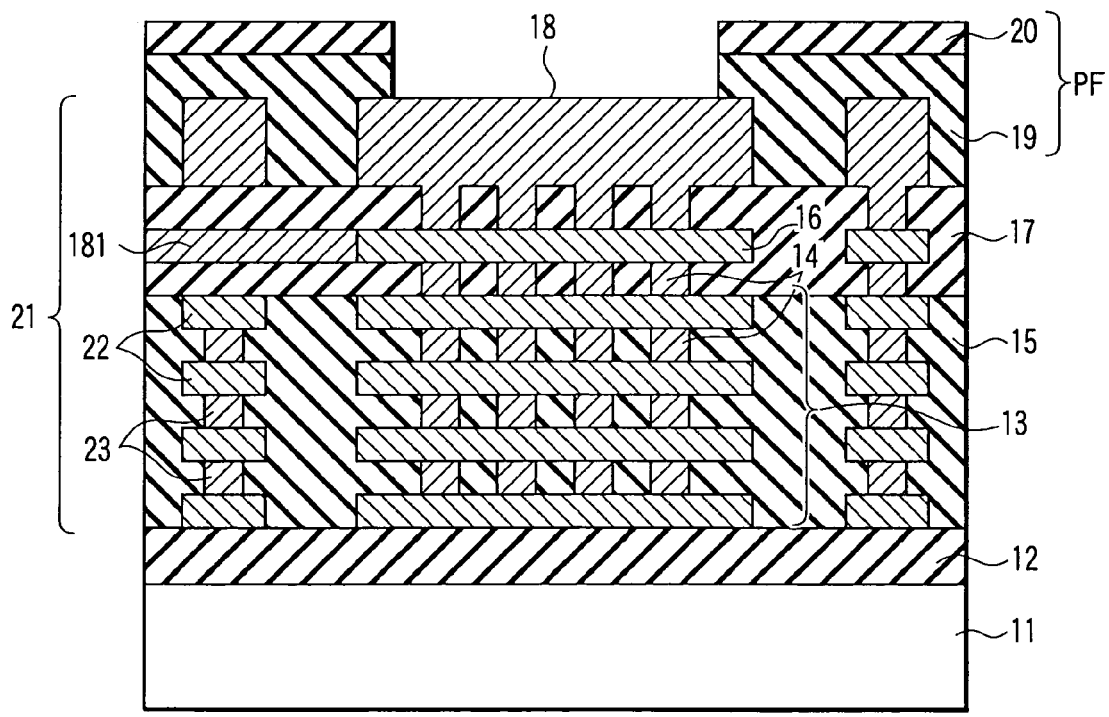
FIG. 11 is a sectional view taken along line 11—11 of FIG. 10.

FIGS. 10 and 11 show a fifth embodiment of the present invention. When a lead-in interconnection layer 181 is associated with the electrode pad 18, it is impossible to form a dummy multilevel interconnection configuration in the shape of a ring at the same level as the interconnection layer 181. In view of the occurrence of cracking, therefore, it is desirable to form the lead-in interconnection layer 181 within the mechanically strong insulating film 17, not within the insulating film 15 of low dielectric constant. That is, as shown in FIG. 10, the lead-in interconnection layer 181 is formed within the insulating film 17. At this time, an opening 182 is formed in that portion of the dummy multilevel interconnection configuration 21 which is positioned in the insulating film 17 and the lead-in interconnection layer 181 is formed in that opening.

According to the fifth embodiment, the opening 182 is formed in a portion of the dummy multilevel interconnection configuration 21 and the lead-in interconnection layer 181 is formed in that opening. Therefore, the occurrence of cracking can be controlled and the required lead-in interconnection 181 can be formed.

The dummy multilevel interconnection may be configured as shown in FIG. 4 or 5, in which case the lead-in interconnection layer 181 can be formed in the space between interconnection patterns.

(Sixth Embodiment)

Figure 12:
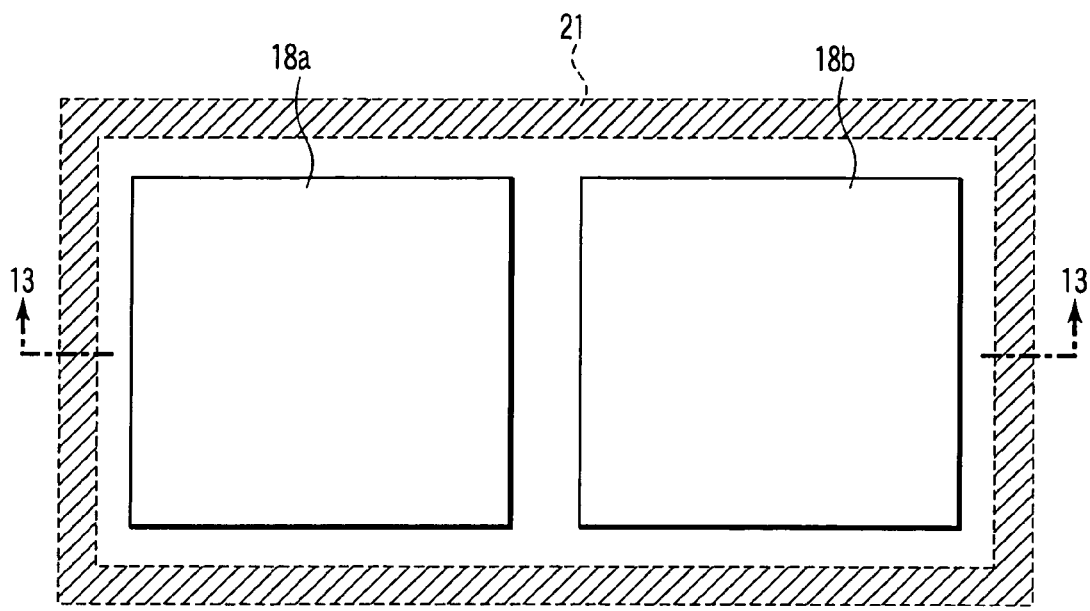
FIG. 12 is a plan view of a semiconductor device according to a sixth embodiment of the present invention.
Figure 13:
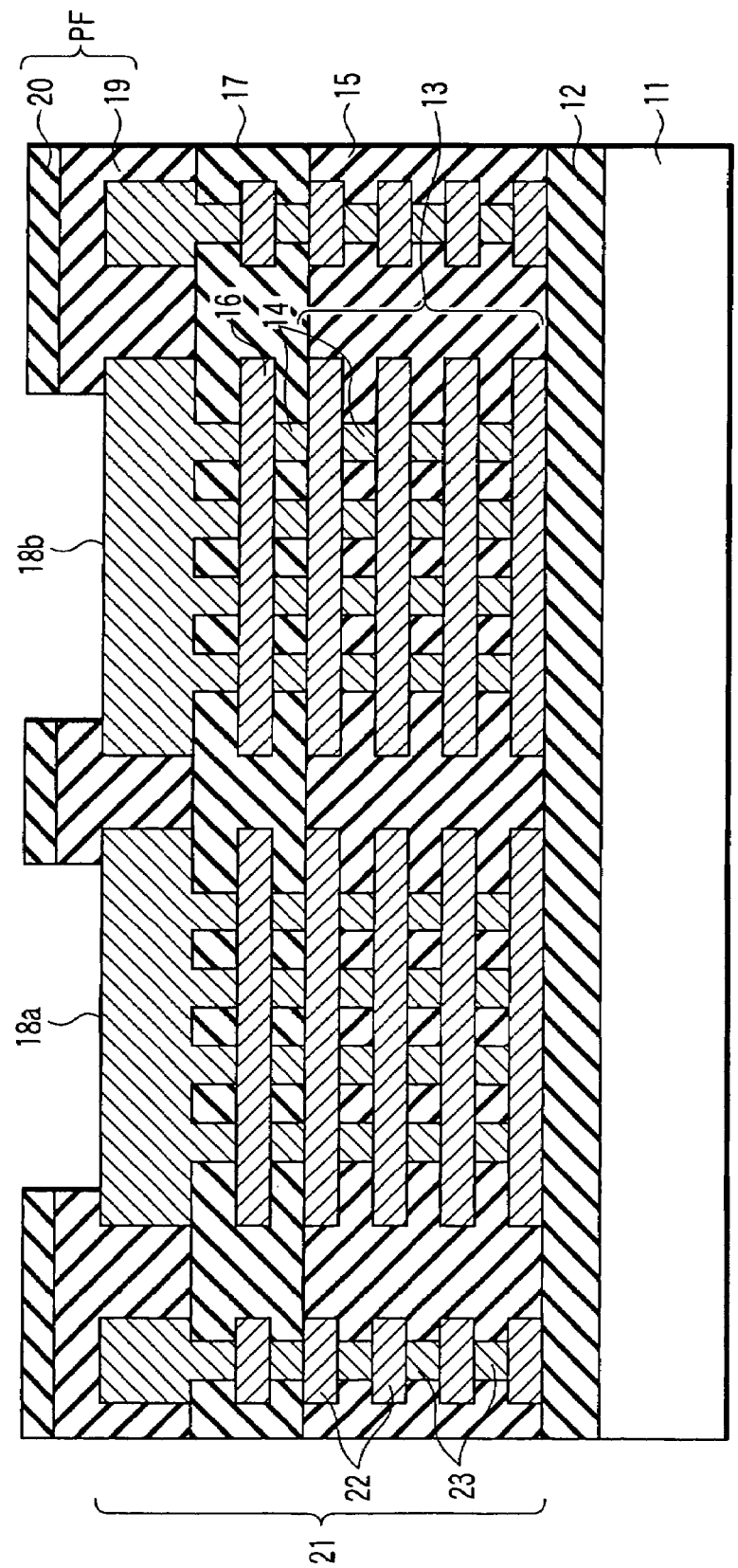
FIG. 13 is a sectional view taken along line 13—13 of FIG. 12.

FIGS. 12 and 13 show a sixth embodiment of the present invention. In the first through fifth embodiments, the dummy multilevel interconnection configuration is formed for one electrode pad. In the sixth embodiment, one or more dummy multilevel interconnection configurations are formed for two or more electrode pads. The pad pitch is usually set to a given value in each LSI generation. It therefore becomes possible to avoid cracking resulting from misalignment of wire bonding in the direction in which the electrode pads are arranged by making the pad spacing small. For this reason, it is recommended that the pad spacing be set to the minimum value in the design rules. Even if, when the spacing between adjacent electrode pads is the minimum value in the design rules, there is an alignment error in wire bonding, the occurrence of cracking in the insulating layer due to the impact of wire bonding can be controlled because the adjacent electrode pads and the underlying interconnection layers serve to reinforce the insulating film. In the sixth embodiment, therefore, no dummy multilevel interconnection configuration is formed between two adjacent electrode pads 18a and 18b, and the dummy multilayer interconnection 21 is formed around the periphery of the two pads as shown in FIGS. 12 and 13. The dummy multilayer interconnection 21 may be configured in the same way as shown in FIG. 3.

Figure 14:
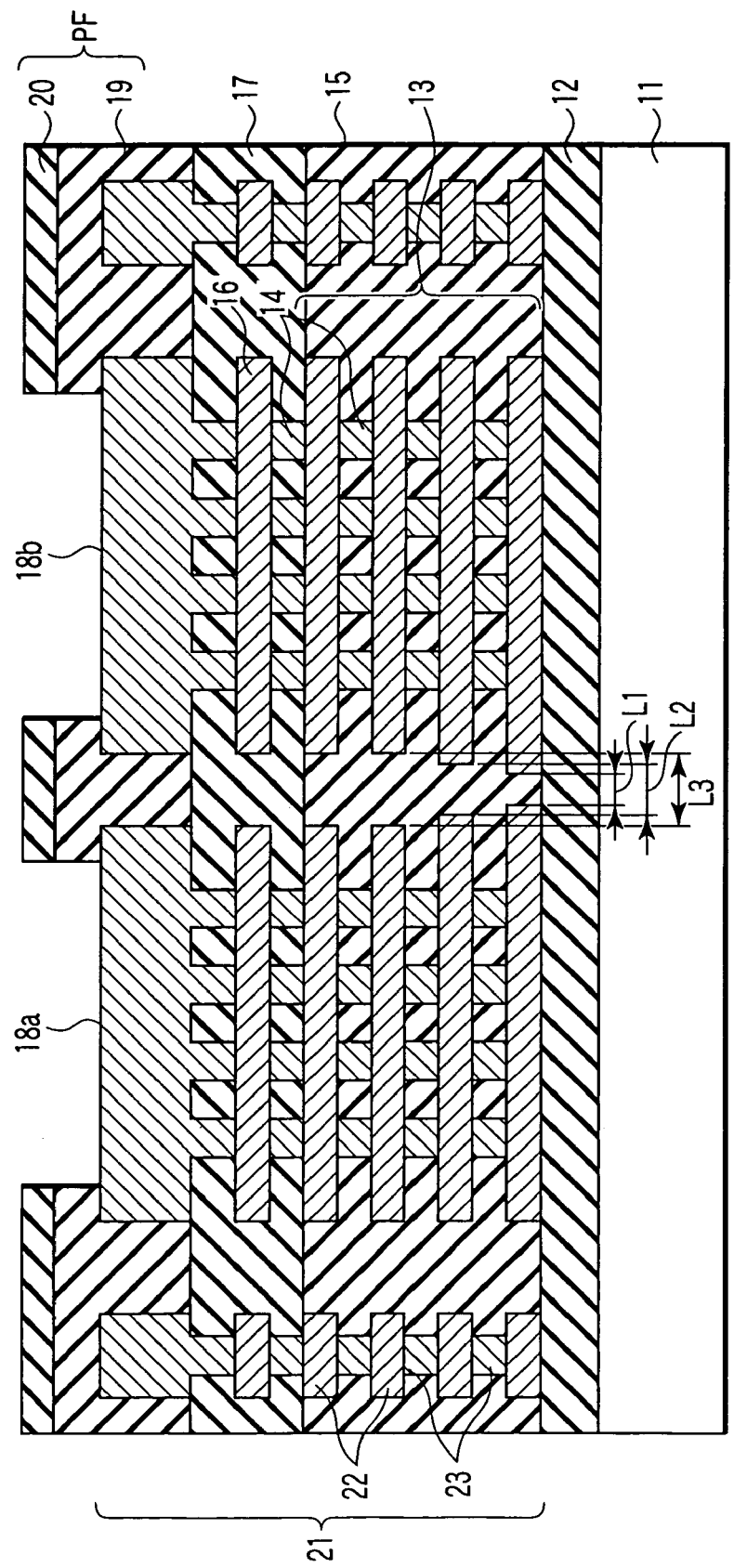
FIG. 14 is a sectional view of a modification of the sixth embodiment of the present invention.

FIG. 14 shows a modification of the sixth embodiment. The spacing between multilevel interconnections below the pads 18a and 18b varies from layer to layer. In general, the spacing L1 between lower interconnection layers is set to be smaller than the spacings L2 and L3 between upper interconnection layers. That is, the horizontal spacing between corresponding interconnection layers varies from layer to layer. In such a case as well, the dummy multilayer interconnection configuration remains unchanged.

Figure 15:
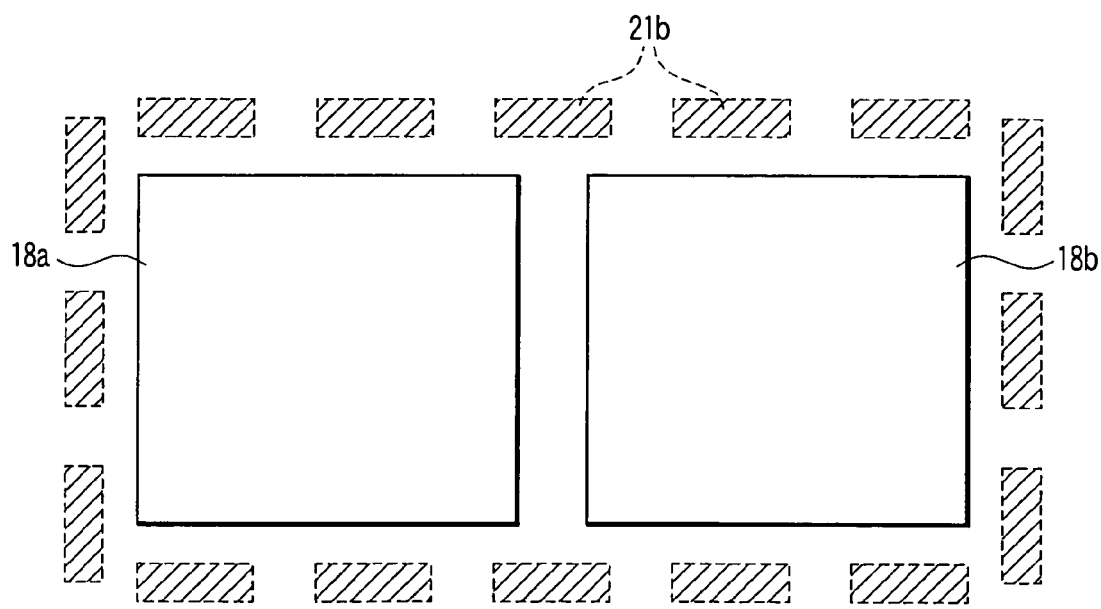
FIG. 15 is a plan view of another modification of the sixth embodiment of the present invention.

FIG. 15 shows a further modification of the sixth embodiment. In FIG. 12, the dummy multilayer interconnection configuration 21 is formed into the shape of a ring so as to surround the two electrode pads 18a and 18b. In FIG. 15, a plurality of dummy multilayer interconnection patterns 21b of, for example, rectangular shape are arranged at regular intervals so as to surround the two electrode pads 18a and 18b. Such a configuration will provide the same advantage as the sixth embodiment.

(Seventh Embodiment)

FIG. 16 shows a seventh embodiment of the present invention. The first through sixth embodiments are adapted to alleviate the impact of wire bonding and thereby prevent cracking from occurring by forming a dummy multilayer interconnection around an electrode pad or pads. In contrast, in the seventh embodiment, an insulating film 41 that is equal to or less than the insulating film 15 of low dielectric constant in Young's modulus is formed on the silicon nitride film 20 in order to further alleviate the impact of wire bonding. As this insulating film, use may be made of a film of, for example, SiOC or SiOCH, which have a Young's modulus of 20 GPa or less.

According to the seventh embodiment, the insulating film 41 that is substantially equal in Young's modulus to the insulating film 15 of low dielectric constant is formed on the silicon nitride film 20. Being small in Young's modulus, the insulating film 41 is easily deformed when subjected to mechanical force. That is, the deformation of the insulating film 41 allows mechanical force applied to the passivation film PF and underlying insulating film to be reduced. For this reason, it becomes possible to prevent cracking from occurring in the passivation film PF and underlying insulating film.

FIG. 17 shows a modification of the seventh embodiment. The insulating film 41 of low Young's modulus formed on the passivation film PF as shown in FIG. 16 may have a hydrophilic property. Since the passivation film PF lies under the insulating film 41, no problem arises in the case where the insulating film 41 absorbs moisture. However, it is desirable that the insulating film have no hydrophilic property. When a hydrophilic insulating film is used, it is recommended to transform it into a water repellent film by subjecting its surface to plasma processing. In FIG. 17, a film 41a formed on the surface of the insulating film 41 is one that is water repellent.

In the configuration shown in FIG. 17, the water repellent insulating film 41a formed on the surface of the insulating film 41 can prevent the insulating film 41 from absorbing water, allowing the film integrity to be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   at least one electrode pad on which a wire is bonded, formed above the semiconductor substrate;
   a multilevel interconnection configuration disposed between the electrode pad and the semiconductor substrate, the multilevel interconnection configuration including a number of interconnection layers;
   a first insulating film of low dielectric constant which is formed above the semiconductor substrate to insulate the interconnection layers from one another; and
   a dummy interconnection configuration formed at least within the first insulating film around the periphery of the electrode pad;
   wherein the dummy interconnection configuration is formed in the shape of a ring around the periphery of the electrode pad, and
   wherein the dummy interconnection configuration is formed in a position corresponding to a displacement of the wire to be bonded to the electrode pad from the periphery of the electrode pad.

2. The semiconductor device according to claim 1, wherein the distance between the dummy interconnection configuration and the multilevel interconnection configuration is set substantially equal to 0.1 µm.

3. The semiconductor device according to claim 1, wherein the dummy interconnection configuration comprises interconnection layers corresponding in number to the interconnection layers of the multilevel interconnection configuration and vias which interconnect the interconnection layers.

4. The semiconductor device according to claim 1, wherein the first insulating film of low dielectric constant is 20 GPa or less in Young's modulus.

5. The semiconductor device according to claim 1, wherein the dummy interconnection configuration is formed at least within the range of thickness of the insulating film of low dielectric constant.

6. The semiconductor device according to claim 1, further comprising:

a second insulating film formed to cover the first insulating film with the electrode pad exposed; and a third insulating film formed on the second insulating film and having a Young's modulus of 20 GPa or less.

7. The semiconductor device according to claim 6, wherein the third insulating film has its top made water repellent.

* * * * *